United States Patent
Beitelmal et al.

(10) Patent No.: US 7,249,718 B2
(45) Date of Patent: Jul. 31, 2007

(54) COOLING SYSTEM WITH A VARIABLE MAXIMUM OPERATION LEVEL

(75) Inventors: Abdlmonem H. Beitelmal, Los Altos, CA (US); Christopher G. Malone, Loomis, CA (US); Chandrakant D. Patel, Fremont, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 499 days.

(21) Appl. No.: 10/894,290

(22) Filed: Jul. 20, 2004

(65) Prior Publication Data

US 2006/0016901 A1    Jan. 26, 2006

(51) Int. Cl.
*F24F 7/00* (2006.01)
*F25D 23/12* (2006.01)
*H05K 5/00* (2006.01)

(52) U.S. Cl. ............... 236/49.3; 62/259.2; 361/690; 361/695

(58) Field of Classification Search ............... 236/49.3; 62/178, 180, 186, 259.2; 361/687, 688, 689, 361/690, 694, 695
See application file for complete search history.

(56) References Cited

U.S. PATENT DOCUMENTS

| 5,285,347 | A  | * | 2/1994  | Fox et al.      | 361/699   |
|-----------|----|---|---------|-----------------|-----------|
| 5,355,689 | A  | * | 10/1994 | Hara et al.     | 62/159    |
| 5,777,897 | A  | * | 7/1998  | Giorgio         | 700/299   |
| 6,134,667 | A  | * | 10/2000 | Suzuki et al.   | 713/300   |
| 6,390,379 | B1 | * | 5/2002  | Huang           | 236/49.3  |
| 6,643,128 | B2 | * | 11/2003 | Chu et al.      | 361/687   |
| 2002/0020755 | A1 | * | 2/2002 | Matsushita    | 236/49.3  |

* cited by examiner

*Primary Examiner*—Marc Norman
(74) *Attorney, Agent, or Firm*—Richard P. Lange

(57) ABSTRACT

A cooling system for an electronic system having at least one heat-generating component includes at least one fan and an operation level setting mechanism. The at least one fan is configured to blow air through the electronic system to thereby dissipate heat generated by the heat-generating component. The operation level setting mechanism is configured to set maximum operation level of the at least one fan, wherein the maximum operation level is based on one or more characteristics of the at least one heat-generating component.

36 Claims, 4 Drawing Sheets

COOLING SYSTEM WITH A VARIABLE MAXIMUM OPERATION LEVEL

BACKGROUND OF THE INVENTION

Microprocessors have been developed to operate at faster speeds while occupying smaller spaces. In addition, electronic systems that house these microprocessors have also been developed to include a relatively dense configuration of microprocessors and other components to maximize processing power while minimizing the space required by the electronic systems. As the microprocessors and electronic systems become smaller and more dense, they also generate larger amounts of heat, thereby increasing the difficulty in maintaining the microprocessors and other components within acceptable temperature levels.

Fans may be employed to dissipate the heat generated by the components contained in the electronic systems. More particularly, fans may blow air through the electronic systems to circulate cool air through the electronic systems.

SUMMARY OF THE INVENTION

A cooling system for an electronic system having at least one heat-generating component is described. The cooling system includes one or more fans and an operation level setting mechanism. The one or more fans are configured to blow air through the electronic system to thereby dissipate heat generated by the heat-generating component. The operation level setting mechanism is configured to set a maximum operation level of the one or more fans, wherein the maximum operation level is based on one or more characteristics of the at least one heat-generating component.

BRIEF DESCRIPTION OF THE DRAWINGS

Features of the present invention will become apparent to those skilled in the art from the following description with reference to the figures, in which.

DETAILED DESCRIPTION OF THE INVENTION

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

A cooling system for relatively densely packed electronic systems, for instance, computers, servers, receivers, image projectors, disk drives, etc., substantially optimizes the power use in the electronic systems. The cooling system generally includes one or more fans configured to circulate air through the electronic system to thereby dissipate heat generated by heat-generating components contained in the electronic system. In one respect, a maximum operational level at which the fans are to operate may be set based upon one or more characteristics of the heat-generating components. By substantially limiting the maximum operation level of the fans, the amount of energy consumed in cooling the electronic systems may substantially be reduced as compared with known fans for electronic systems. In addition, when the energy savings are considered for a number of electronic systems, for instance, the electronic systems in a data center, the amount of energy savings may be quite substantial.

Figure 1:
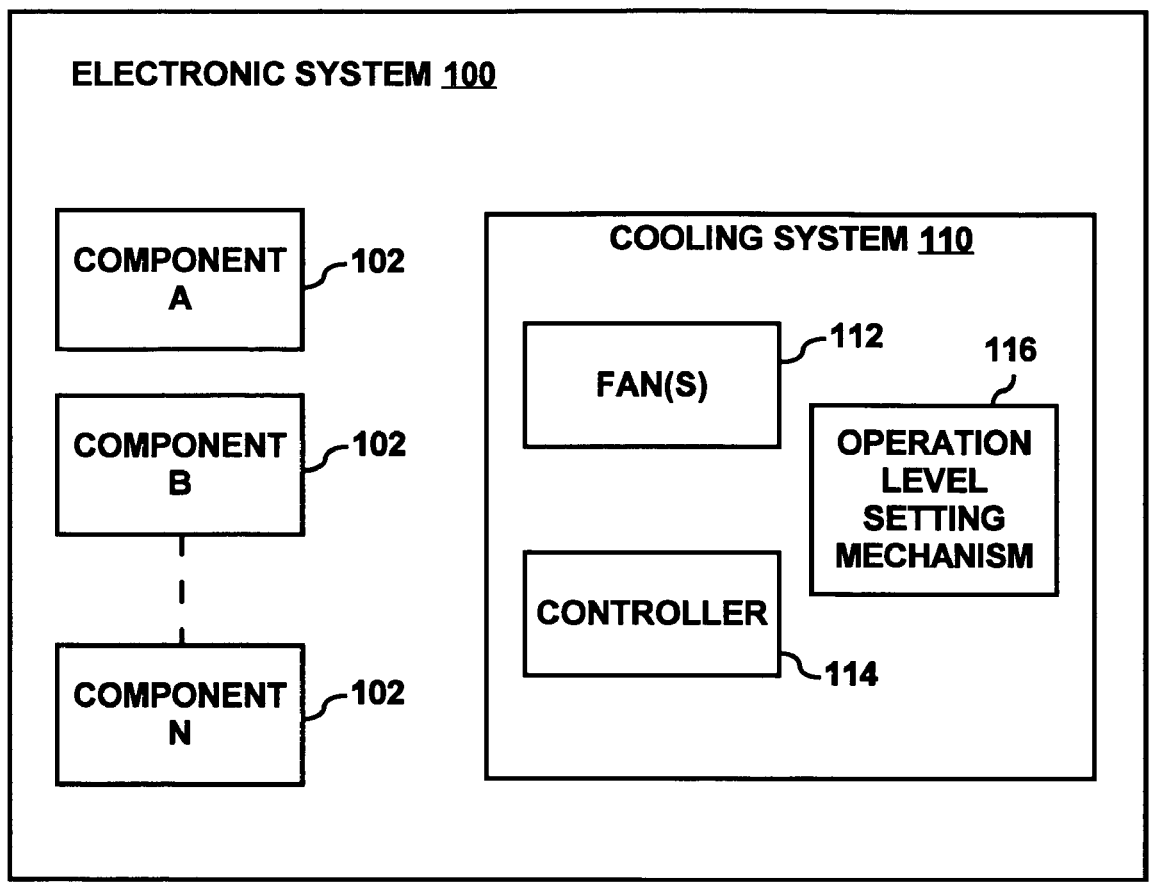
FIG. 1 is a block diagram illustrating an embodiment of an electronic system including a cooling system having a controllable maximum operation level.

With reference now to the drawings and particularly to FIG. 1, there is shown a simplified block diagram of an electronic system 100. The electronic system 100 depicted in FIG. 1 represents a generalized illustration. Therefore, other components and design features may be added or existing components or design features may be removed or modified without departing from the scope of the invention. For example, the electronic system 100 may also include various other components in addition to those illustrated in FIG. 1.

The electronic system 100 may comprise any system that includes heat-generating components. The electronic system 100 may therefore comprise, for instance, a computer, a server, a server mountable on a rack, a stereo receiver, a disk drive, etc. The electronic system 100 is illustrated as including one or more components 102 (shown as Components A-N). The components 102 generally include heat-generating components, such as, processors, memory devices, input/output devices, etc.

The electronic system 100 also includes a cooling system 110. The cooling system 110 may include at least one fan 112 to cool the one or more components 102 by causing airflow through the electronic system 100. The at least one fan 112 may include a plurality of fans 112, such as, a bank of fans 112. The at least one fan 112 may also be situated at any reasonably suitable location in the electronic system 100. In addition, the at least one fan 112 may comprise one or more fans that are integrally fabricated with the electronic system 100 or the at least one fan 112 may comprise a separate unit that is attached to the electronic system 100.

The cooling system 110 also includes a controller 114 and an operation level setting mechanism 116. The controller 114 controls the operation of the fan(s) 112. For example, the controller 114 may turn the fans 112 on and off. The controller 114 may also control the speed at which the fans 112 operate. The controller 114 may comprise a microprocessor, a micro-controller, an application specific integrated circuit (ASIC), and the like.

The level setting mechanism 116 sets the operation level of the at least one fan 112. The level setting mechanism 116 may set the maximum operation level of the fan(s) 112 and/or the operation level of the fan(s) 112. The maximum operation level represents the maximum level at which the fan(s) 112 may operate. The operation level of the fan(s) 112 represents the level at which the fan(s) 112 operate. In operation, the controller 114 receives the operation level setting and/or maximum operation level settings from the level setting mechanism 116 and uses the settings to control operation of the fan(s) 112. In controlling the operation of the fan(s) 112, the controller 114 may be configured to control one or both of the speed at with the one or more fans 112 operate and the number of fans 112 that are operated.

The maximum operation level of the fan(s) 112 may be set based on characteristics of the components 102. The possible operation level of fans 112, such as the number and speed of fans 112, in the cooling system 110 may be based on the maximum power consumption properties of the electronic system 100. For example, the number of fans 112 may be based on a fully configured electronic system 100, where the maximum number of components 102 having the maximum power consumption properties is mounted in the electronic system 100. Alternatively, however, the electronic system 100 may not be fully configured. For example, the electronic system 100 may not include the maximum number of components 102 and/or the power consumption characteristics of the components 102 in the electronic system 100 may be less than the permitted power consumption properties. When the electronic system 100 is not fully configured, the level setting mechanism 116 may set the maximum operation level of the fans 112 to a level lower than the possible operation level of the fan(s) 112.

The maximum operation level of the fans 112 may include setting the number of fans 112 that are enabled to operate when cooling is needed. For example, if the electronic system 100 includes 10 fans, the maximum operation level may include enabling 6 of the 10 fans to operate. The maximum operation level of the fans 112 may alternatively, or also, include setting the speed of the fan(s) 112 to be lower than the maximum possible speeds of the fan(s) 112. For example, if the fan(s) 112 include speed settings of 0 to 3 with 3 being the highest, the maximum operation level of the fan(s) 112 may include enabling the fan(s) 112 to be operated at a maximum speed of 1. In an alternative example, the maximum operation level may include a combination of setting the number of fan(s) 112 enabled and the speeds of the fan(s) enabled.

As another example, the maximum operation level of the fan(s) 112 may be set based on the characteristics of the components 102. In this example, the level setting mechanism 116 may detect the characteristics of the components 102. The characteristics of the components may include the number of components 102 present in the electronic system 100, the type of the components 102, the power consumption properties of the components 102, etc. For example, if the possible power consumption of an electronic system 100 is 200 W, and the power consumption properties of the components 102 present in the electronic system 100 is 140 W, the maximum operation level of the fan(s) 112 may be set to 70% of the possible operation level.

In a further example, if the electronic system 100 is configured to accept 10 components 102 and 3 components 102 are present in the electronic system 100, the maximum operation level of the fan(s) 112 may be set to 30% of the possible operation level of the fan(s) 112. The level setting mechanism 116 may also detect the characteristics of the components 102 when the configuration of the components 102 has been changed in any way, such as, for example, if additional components 102 are added or removed.

In addition, or alternatively, a user may enter the characteristics of the components 102 instead of detection by the level setting mechanism 116. In this instance, a user may enter the type, power consumption properties, or number of the components present in the electronic system 100. This information may be received through an interface with the user, for instance, through a keyboard, a removable storage drive, etc., as described in greater detail with respect to FIG. 4.

The maximum operation level of the fan(s) 112 may also be set based upon information contained in a lookup table (not shown). In this example, the look-up table may include a listing of various configurations of the components 102 in relation to corresponding maximum operation settings of the fan(s) 112. The look-up table may, for instance, be stored in a memory (not shown) that may be accessed by the operation level setting mechanism 116. Thus, for example, if the operation level setting mechanism 116 detects the configuration or characteristics of the components 102, the operation level setting mechanism 116 may set the maximum operation level of the fan(s) 112 based upon an entry in the look up table corresponding to the detected configuration.

The operation level of the fan(s) 112 may be set to a level in between and including the fans being off and the maximum operation level of the fan(s) 112. For example, if the fan(s) 112 include only two settings, the operation level of the fan(s) 112 will be off when higher air flow rates are not needed and the operation level of the fan(s) 112 will be the maximum operation level when higher air flow rates are needed. If the operation of the fan(s) 112 includes three or more settings, the operation levels of the fan(s) 112 will include the fans 112 being off, the fans 112 operating at the maximum operation level when a maximum amount of air flow rates are needed, and at least one operation level in between the fans 112 being off and the maximum operation level.

The operation level of the fan(s) 112 may be dependent upon a measured temperature difference in the electronic system 100. For example, a measured temperature difference that exceeds a set trigger temperature difference may cause the fan(s) 112 to turn on or to be set to operate at a predetermined operation level. The trigger temperature difference may be input by a user or preset by a manufacturer of the electronic system 100, one or more components 102, etc. The trigger temperature may, for instance, be preset to 15 degrees C. However, in one example, a preset trigger temperature (15 degrees C.) may be changed to 20 degrees C. to for instance, conserve power. In certain instances, by increasing the trigger temperature, the components 102 may be maintained under safe operating conditions while running fewer fans or by running the fans at slower speeds. In this regard, the amount of energy required to substantially maintain the temperatures of the components in safe ranges may be reduced, thereby conserving power and reducing the costs associated with operating the electronic system 100.

The measured temperature difference may include a measured temperature difference between an inlet position and an outlet position of the electronic system 100. The measured temperature difference between the inlet position and the outlet position may be measured using an inlet temperature sensor and an outlet temperature sensor and subtracting the temperature measured by the inlet temperature sensor from the temperature measured by the outlet temperature sensor. In addition, or alternatively, the temperature measurements may be obtained at various locations within the electronic system 100. For instance, temperature sensors may be positioned at various locations between the inlet position and the outlet position. Data obtained from these temperature sensors may be employed to determine temperature differences at various sub-sections of the electronic system 100. In one regard, the detection of the temperature differences at the various sub-sections may yield greater granularity in the operations of the fan(s) 112.

The measured temperature difference may also be used to set the operation level of the fan(s) 112. For example, if the fan(s) 112 are configured to operate at a level between off and the maximum operation level, the measured temperature difference may be used to determine if the fan(s) 112 should be operated at the maximum operation level or a level below the maximum operation level. In the instance that multiple temperature differences for various sub-sections of the electronic system 100 are employed, the fan(s) 112 may be operated in substantially independent operation levels according to the temperature differences in the sub-sections that the fan(s) 112 substantially influence.

Thus, for example, the fan(s) 112 may be configured to operate at levels of 0 to 2 with 0 representing the off position and 2 representing the maximum operation level. Continuing the example, if the measured temperature difference exceeds a first trigger temperature, but is below a second trigger temperature, the fan(s) 112 maybe set to operate at operation level 1.

As another example, the operation levels of the fan(s) 112 may be set according to the detected temperatures of one or more components 102 in the electronic system 100. Thus, for instance, the operation levels of the fan(s) 112 may be set to operate at operation level 1 when the detected temperatures of one or more components 102 are below or equal to a first predetermined temperature. In addition, the operation levels of the fan(s) 112 may be set to operate at operation level 2 when the detected temperatures of one or more components 102 are below or equal to a second predetermined temperature, but above the first predetermined temperature. In instances where multiple components 102 include respective temperature sensors, fan(s) 112 associated with respective components 102 may have differing maximum operation levels and may also be operated at differing levels depending upon the temperatures of the respective components 102.

Figure 2:
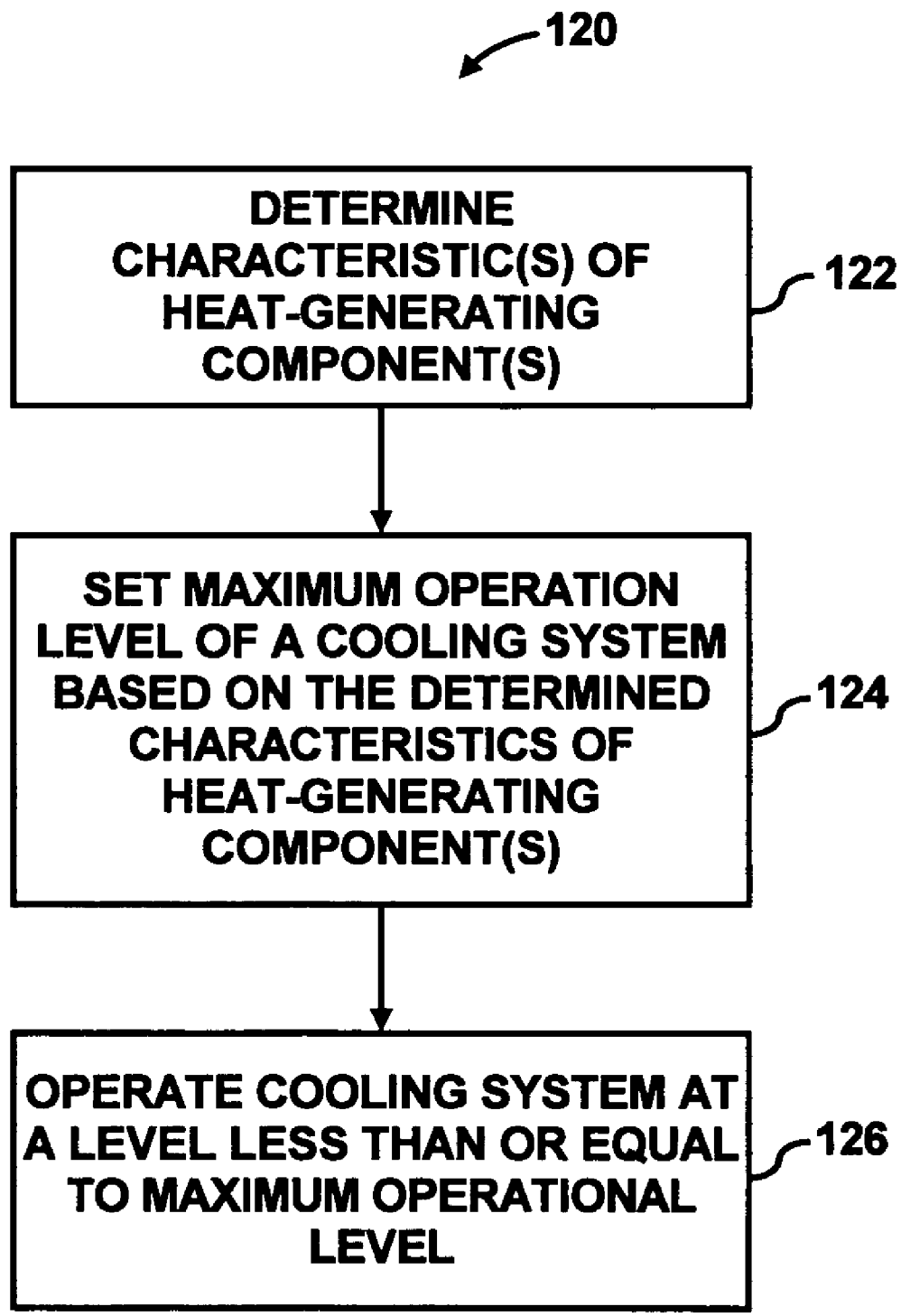
FIG. 2 is a flow diagram illustrating an embodiment of a method for controlling a cooling system.

FIG. 2 is a flow diagram illustrating an operational mode 120 of a method for controlling a cooling system to dissipate heat generated by components in an electronic system. It is to be understood that the following description of the operational mode 120 is but one manner of a variety of different manners in which a method for controlling a cooling system may be practiced. It should also be apparent to those of ordinary skill in the art that the operational mode 120 represents a generalized illustration and that other steps may be added or existing steps may be removed, modified or rearranged without departing from the scope of the operational mode 120.

Figure 3:
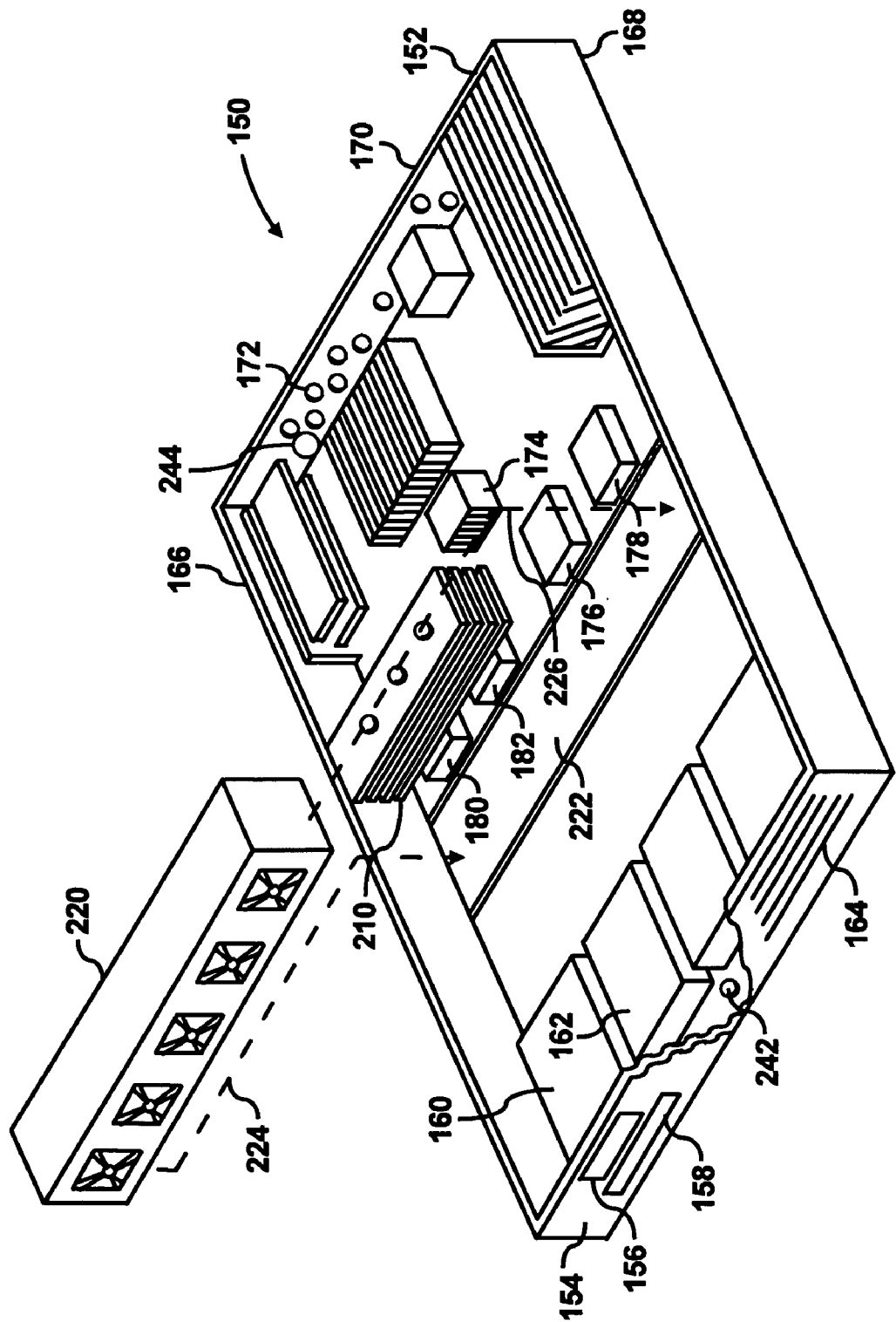
FIG. 3 is a partially exploded, perspective view of an electronic system according to an embodiment of the invention.

The description of the operational mode 120 is made with reference to FIGS. 1 and 3, and thus makes reference to the elements cited therein. It should, however, be understood that the operational mode 120 is not limited to the elements set forth in FIGS. 1 and 3. Instead, it should be understood that the operational mode 120 may be practiced by a cooling system controlling process having a different configuration than that set forth in FIGS. 1 and 3.

The operational mode 120 may be initiated or started as indicated at step 122. The initiation of the operational mode 120 may include determining at least one characteristic of one or more heat-generating component(s) 102, 174-182. Determining the characteristic(s) of the heat-generating component(s) 102, 174-182 may include counting the heat-generating component(s) 102, 174-182 present in the electronic system 100, 150, determining the type of the heat-generating component(s) 102, 174-182 present in the electronic system 100, 150, determining power consumption properties of the heat-generating component(s) 102, 174-182, determining critical temperatures of the heat-generating component(s) 102, 174-182, etc. Determining the characteristic(s) of the heat-generating component(s) 102, 174-182 may also include receiving user input regarding characteristics of the heat-generating component(s) 102, 174-182 and/or detecting characteristics of the at least one heat-generating component 102, 174-182.

At step 124, the operational mode 120 further includes setting a maximum operation level of the cooling system 110, for instance, the fan(s) 112 and the fan cell 220. Setting the maximum operation level may include setting a maximum speed of at least one of fan 112 in the cooling system 110. Setting the maximum operation level may also include setting a number of the fans 112 in the cooling system 110 enabled to operate, when two or more fans 112 are in the cooling system 110. The maximum operation level of the fans 112 in the cooling system 110 may further be set in response to a change in configuration of the heat-generating component(s) 102, 174-182. For example, if more components 102, 174-182 are added, the level setting mechanism 116 may raise the maximum operation level of the cooling system 110 to enable more fans 112 to operate and/or increase the speeds of the fans 112 enabled to operate.

The maximum operation level of the cooling system 110 may be set based on a look up table. The look up table may list maximum operation level of the cooling system 110 corresponding to configurations of the heat-generating component(s) 102, 174-182. Thus, when a particular configuration of components 102, 174-182 is detected or entered by a user, the level setting mechanism 116 may set the maximum operation level corresponding to the particular configuration listed in the look up table.

At step 126, the operational mode 120 further includes operating the cooling system 110 at an operation level less than or equal to the maximum operation level. Operating the cooling system 110 may include setting an operation level for the cooling system 110. The operation level of the cooling system 110 may be set at a level between the fan(s) 112 of the cooling system 110 being off and the maximum operation level, if the operation of the cooling system 110 includes more than two levels.

The operation level of the cooling system 110 may be based on a measured temperature difference in the electronic system 110. The measured temperature difference may be measured by measuring an inlet temperature at an inlet position of the electronic system 100, 150 and measuring an outlet temperature at an outlet position of the electronic system 100, 150. The measured temperature difference may be determined by taking the difference in measurement between the inlet temperature and the outlet temperature. The inlet temperature may be measured using an inlet temperature sensor, as shown by element 242 in FIG. 3, below. The outlet temperature may be measured using an outlet temperature sensor, as shown by element 244 in FIG. 3, below.

In addition, or alternatively, the temperature measurements may be obtained at various locations within the electronic system 100, 150. For instance, temperature sensors (not shown) may be positioned at various locations between the inlet position and the outlet position. Data obtained from these temperature sensors may be employed to determine temperature differences at various sub-sections of the electronic system 100, 150. In one regard, the detection of the temperature differences at the various sub-sections may yield greater granularity in the operations of the fan(s) 112.

As another example, the operation levels of the fan(s) 112 may be set according to the detected temperatures of one or more components 102, 174-182 in the electronic system 100, 150. Thus, for instance, the operation levels of the fan(s) 112 may be set to operate at operation level 1 when the detected temperatures of one or more components 102, 174-182 are below or equal to a first predetermined temperature. In addition, the operation levels of the fan(s) 112 may be set to operate at operation level 2 when the detected temperatures of one or more components 102, 174-182 are below or equal to a second predetermined temperature, but above the first predetermined temperature. In instances where multiple components 102, 174-182 include respective temperature sensors, fan(s) 112 associated with respective components 102, 174-182 may have differing maximum operation levels and may also be operated at differing levels depending upon the temperatures of the respective components 102.

Operation of the fan(s) 112 of the cooling system 110 at the operation level may be initiated in response to the measured temperature difference exceeding a triggering temperature difference. The triggering temperature difference may be a user inputted triggering temperature or a factory preset triggering temperature difference. In certain instance, the factory preset triggering temperature difference may also be adjustable by user input. For example, a user may have a choice between a lower triggering temperature that would keep the components 102 cooler or a higher triggering temperature that would reduce power consumption by the fan(s) 112.

The order of the steps described in operational mode 120 may be performed in any order or simultaneously. The operations set forth in the operational mode 120 may be contained as a utility, program, or subprogram, in any desired computer accessible medium. In addition, the operational mode 120 may be embodied by a computer program, which can exist in a variety of forms both active and inactive. For example, it can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

FIG. 3 is a partially exploded, perspective view of an electronic system 150 that may employ various features of the operational mode 120 depicted in FIG. 2. The electronic system 150 depicted in FIG. 3 comprises a server configured for mounting in a rack (not shown). The electronic system 150 represents a generalized illustration and, therefore, other components and design features may be added or existing components or design features may be removed or modified without departing from the scope of the invention. For example, the electronic system 150 may include various openings for venting air through an interior of the electronic system 150.

The electronic system 150 includes a housing 152 with a top section of the housing 152 removed for purposes of illustration. In addition, a part of a front section 154 of the housing 152 has been cut-away to more clearly show some of the components contained in the electronic system 150. The front section 154 is illustrated as containing various features to enable access to components mounted in the electronic system 150. For instance, the front section 154 includes openings 156 and 158 for insertion of various media, for example, diskettes, flash memory cards, CD-Roms, etc. Located substantially directly behind the openings 156 and 158 are data storage devices 160 and 162 configured to read and/or write onto the various media. The front section 154 also includes vents 164 for enabling airflow into the housing 152.

The housing 152 also includes a plurality of side sections 166 and 168 and a rear section 170. The rear section 170 includes openings 172 to generally enable airflow out of the housing 152. Although not clearly shown in FIG. 3, the rear section 170 also includes openings for insertion of wires, cables, and the like into the housing 152 for connection to various components contained in the housing 152. In addition, some of the openings 172 in the rear section 170 may include devices to enable interfacing of certain components contained in the housing 152.

Contained within the housing 152 are a plurality of heat-generating components 174-182. Some of the heat-generating components 174-182 may comprise microprocessors, power converters, memory controllers, power supplies, disk drives, etc. It should be readily appreciated that the electronic system 150 depicted in FIG. 3 represents a generalized illustration and that other components and design features may be added or existing components or design features may be removed or modified without departing from the scope of the invention. For example, the housing 152 may include various other openings for venting air through an interior of the housing 152 and various devices for mating the electronic system 150 to a rack. The electronic system 150 may also include various other components in addition to those illustrated in FIG. 3.

A cooling system is also illustrated in FIG. 3. The cooling system includes an optional heat sink 210 and a fan cell 220. The heat sink 210 may be useful in dissipating heat from one or more of the heat-generating components 174-182 by supplying a relatively larger surface area from which heat may be dissipated through convection. The fan cell 220 is composed of fans for blowing air through the electronic system 150. The fan cell 220 is depicted as containing five fans for illustrative purposes only and may therefore contain any reasonably suitable number of fans, for instance, from 1 to 10 or more fans. The fans contained in the fan cell 220 may comprise relatively low capacity fans or they may comprise high capacity fans that may be operated at low capacity levels. In addition, the fans may have sufficiently small dimensions to enable their placement in the housing 152 without, for instance, substantially interfering with the operations of other components contained in the housing 152. In addition, the fans of the fan cell 220 may be configured to generate airflow at around 5-10 cfm. The cooling system may also include an inlet temperature sensor 242 and an outlet temperature sensor 244 to measure inlet and outlet temperature as described above.

The fan cell 220 may be positioned in the housing 152 in a fan mount 222 as indicated by the arrows 224 and 226. The operation of the fan cell 220 is similar to the operation of fans 112 described above. Thus, the disclosure cited hereinabove pertaining to the cooling system 110 is relied upon as providing adequate disclosure of the various elements and examples of the cooling system.

Figure 4:
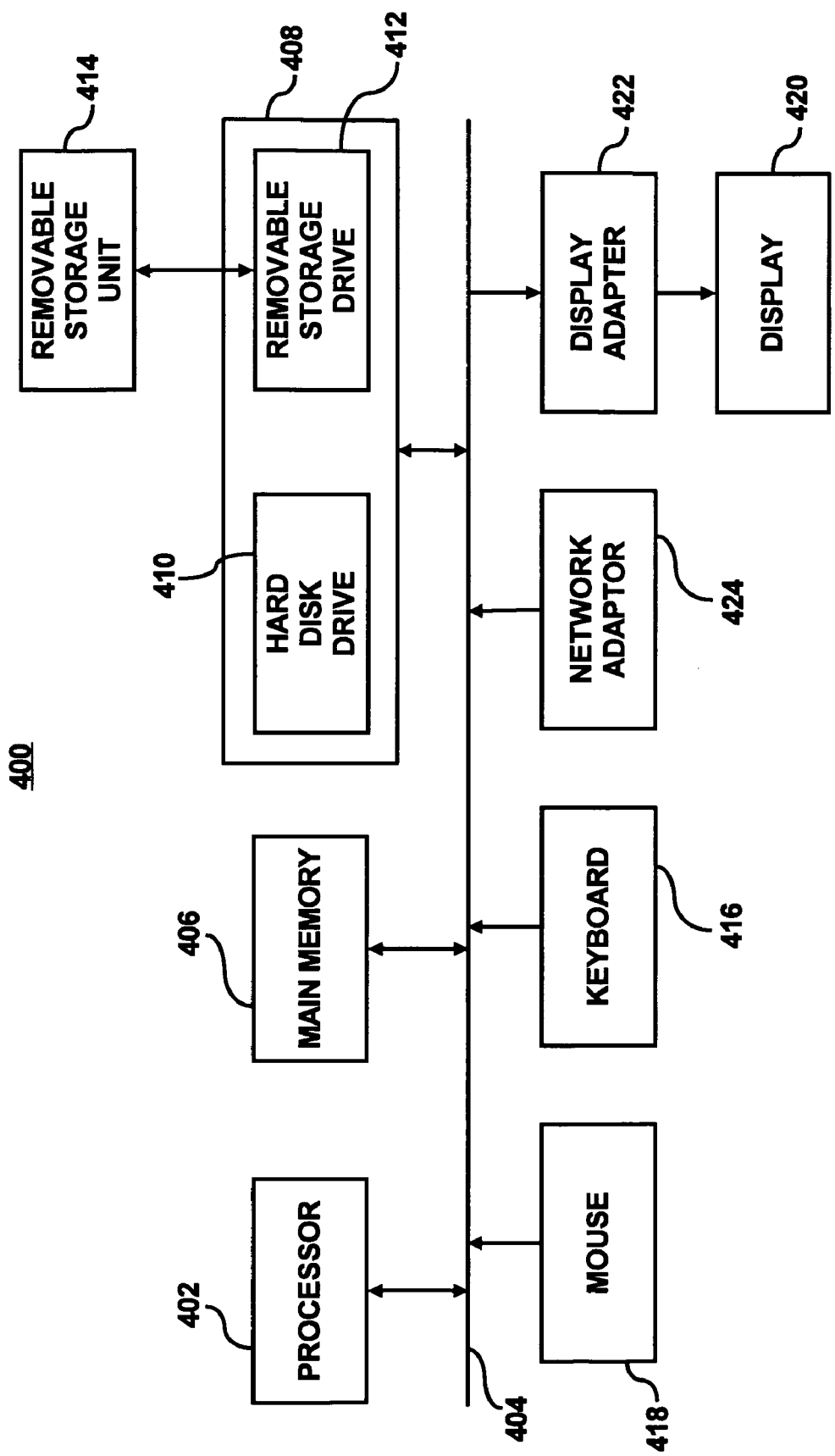
FIG. 4 illustrates a computer system configured to perform the steps outlined in FIG. 2.

FIG. 4 illustrates an exemplary computer system 400, according to an embodiment. The computer system 400 may include, for example, the controller 114, the operation level setting mechanism 116, etc. In this respect, the computer system 400 may be used as a platform for executing one or more of the functions described hereinabove with respect to operational mode 120.

The computer system 400 includes one or more controllers, such as a processor 402. The processor 402 may be used to execute some or all of the steps described in the operational mode 120. Commands and data from the processor 402 are communicated over a communication bus 404. The computer system 400 also includes a main memory 406, such as a random access memory (RAM), where a program code may be executed during runtime, and a secondary memory 408. The secondary memory 408 includes, for example, one or more hard disk drives 410 and/or a removable storage drive 412, representing a floppy diskette drive, a magnetic tape drive, a compact disk drive, etc., where a copy of the program code for the cooling system 110 may be stored.

The removable storage drive 410 reads from and/or writes to a removable storage unit 414 in a well-known manner. User input and output devices may include a keyboard 416, a mouse 418, and a display 420. A display adaptor 422 may interface with the communication bus 404 and the display 420 and may receive display data from the processor 402 and convert the display data into display commands for the display 420. In addition, the processor 402 may communicate over a network, for instance, the Internet, LAN, etc., through a network adaptor 424.

It will be apparent to one of ordinary skill in the art that other known electronic components may be added or substituted in the computer system 400. In addition, the computer system 400 may include a system board or blade used in a rack in a data center, a conventional "white box" server or computing device, etc. Also, one or more of the components in FIG. 4 may be optional (for instance, user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A cooling system for an electronic system having at least one heat-generating component, the cooling system comprising:
   one or more fans, said one or more fans being configured to blow air through the electronic system to thereby dissipate heat generated by the at least one heat-generating component; and
   an operation level setting mechanism, said mechanism being configured to set a maximum operation level of the one or more fans, wherein the maximum operation level is based on at least one of a number and a type of the at least one heat-generating component contained in the electronic system.

2. The cooling system of claim 1, wherein the maximum operation level comprises a maximum speed of at least one of the one or more fans.

3. The cooling system of claim 1, wherein said one or more fans comprises at least two fans, and the maximum operation level comprises a number of said at least two fans enabled to operate.

4. The cooling system of claim 1, wherein the maximum operation level of the one or more fans is less than a maximum possible operation of the one or more fan.

5. The cooling system of claim 1, wherein said mechanism is further configured to set the maximum operation level of the one or more fans based upon a change to the configuration of the at least one heat-generating component in the electronic system.

6. The cooling system of claim 1, wherein said mechanism is configured to set the maximum operation level of said one or more fans based on a look up table listing maximum operation levels of the one or more fans corresponding to configurations of the at least one heat-generating component.

7. The cooling system of claim 1, wherein said mechanism is further configured to set an operation level of said one or more fans, said operation level comprising a level of operation of said one or more fans between and including said one or more fans being off and said one or more fans operating at said maximum operation level.

8. The cooling system of claim 7, wherein said mechanism is further configured to set said operation level of said one or more fans based on one or more measured temperature differences in the electronic system.

9. The cooling system of claim 8, further comprising:
   an inlet temperature sensor and an outlet temperature sensor, wherein the measured temperature difference comprises the difference in measurement between a temperature measured by the inlet temperature sensor and a temperature measured by the outlet temperature sensor.

10. The cooling system of claim 8, wherein the one or more fans is configured to operate at the operation level in response to the measured temperature difference exceeding a triggering temperature difference.

11. The cooling system of claim 10, wherein the triggering temperature difference comprises at least one of a user defined triggering temperature difference and a preset triggering temperature difference.

12. The cooling system of claim 7, wherein said mechanism is further configured to set said operation level of said one or more fans based on detected temperatures of one or more components contained in the electronic system.

13. The cooling system of claim 1, wherein said mechanism comprises at least one of a software application and firmware.

14. An electronic system, said electronic system comprising:
   at least one heat-generating component; and
   a cooling system comprising:
     one or more fans, said one or more fans being configured to blow air through the electronic system to thereby dissipate heat generated by the at least one beat-generating component, and
   an operation level setting mechanism, said mechanism being configured to set maximum operation levels of the one or more fans, wherein the maximum operation levels are based on at least one of a number and a type of heat-generating components contained in the electronic system, and wherein the maximum operation levels of the one or more fans is less than a maximum possible operation of the one or more fans.

15. The electronic system of claim 14, further comprising at least one processor board on which said at least one heat-generating component is mounted, wherein said mechanism is configured to determine maximum operation levels of the one or more fans based on a configuration of said at least one processor board.

16. The electronic system of claim 14, further comprising at least one server in which said at least one heat-generating component is housed, wherein said mechanism is configured to determine maximum operation levels of the one or more fans based on a configuration of the at least one server.

17. A method of controlling a cooling system to dissipate heat generated by at least one heat-generating component in an electronic system, said method comprising:

determining at least one of a number and a type of the at least one heat-generating component contained in the electronic system;

setting a maximum operation level of a cooling system comprising one or more fans based on the determined at least one of the number and the type of the at least one heat-generating component; and operating the one or more fans at operation levels less than or equal to the maximum operation level.

18. The method of claim 17, wherein the step of setting the maximum operation level further comprises setting the maximum operation level of the one or more fans to a level that is less than a maximum possible operation level of the one or more fans.

19. The method of claim 17, wherein to stop of determining at least one of the number and the type of the at least one heat-generating component comprises receiving user input regarding the at least one of the number and the type of the at least one heat-generating component.

20. The method of claim 17, wherein the step of setting the maximum operation levels comprises setting a maximum speed of at least one of the one or more fans.

21. The method of claim 17, wherein the one or more fans comprise at least two fans, and wherein the step of setting the maximum operation levels comprises enabling one or more of the at least two fans to operate.

22. The method of claim 17, further comprising re-setting the maximum operation levels of the one or more fans in response to a change in at least one of the number and the type of the at least one heat-generating component contained in the electronic system.

23. The method of claim 17, wherein the step of setting the maximum operation levels of the one or more fans comprises setting the maximum operation levels of the one or more fans based on a look up table listing maximum operation levels of the one or more fans corresponding to various configurations of at least one of the number and the type of the at least one heat-generating component contained in the electronic system.

24. The method of claim 17, further comprising setting the operation levels of the one or more fans at levels between the one or more fans being off and the maximum operation levels.

25. The method of claim 17, further comprising setting the operation levels of the one or more fans based on one or more measured temperature differences in the electronic system.

26. The method of claim 17, further comprising:
measuring an inlet temperature at an inlet position of the electronic system; and
measuring an outlet temperature at an outlet position of the electronic system, wherein the measured temperature difference comprises the difference in measurement between the inlet temperature and the outlet temperature.

27. The method of claim 26, wherein the stop of operating the one or more fans at the operation levels comprises operating the one or more fans at the operation levels in response to the measured temperature difference exceeding a triggering temperature difference.

28. The method of claim 26, further comprising receiving a user input triggering temperature.

29. The method of claim 26, wherein the triggering temperature difference comprises a preset triggering temperature difference.

30. The method of claim 17, further comprising setting the operation levels of the one or more fans based on detected temperatures of one or more components contained in the electronic system.

31. A system for controlling a cooling system to dissipate heat generated by at least one beat-generating component in an electronic system, said system comprising:
means for determining at least one of a number and a type of the at least one heat-generating component contained in the electronic system;
means for setting a maximum operation level of a cooling system comprising one or more fans based on the determined at least one of the number and the type of the at least one heat-generating component, wherein the maximum operation level of the one or more fans is less than a maximum possible operation of the one or more fans; and
means for operating the one or more fans at an operation level less than or equal to the maximum operation level.

32. The system of claim 31, further comprising means for setting the operation levels of the one or more fans at levels between the one or more fans being off and the maximum operation level.

33. The system of claim 31, further comprising means for setting the operation levels of the one or more fans based on one or more measured temperature differences in the electronic system.

34. The system of claim 33, further comprising:
means for measuring an inlet temperature at an inlet position of the electronic system; and
means for measuring an outlet temperature at an outlet position of the electronic system, wherein the measured temperature difference comprises the difference in measurement between the inlet temperature and the outlet temperature.

35. The system of claim 31, further comprising:
means for setting the operation levels of the one or more fans based on detected temperatures of one or more components contained in the electronic system.

36. A computer readable storage medium on which is embedded one or more computer programs, said one or more computer programs implementing a method for controlling a cooling system to dissipate heat generated by at least one heat-generating component in an electronic system, said one or more computer programs comprising a set of instructions for:
determining at least one of a number and a type of the at least one heat-generating component in the electronic system;
setting a maximum operation level of a cooling system comprising one or more fans based on the determined at least one of the number and the type of the at least one heat-generating component, wherein the maximum operation level of the one or more fans is less than a maximum possible operation of the one or more fans; and
operating the one or more fans at operation levels less than or equal to the maximum operation level.

* * * * *

UNITED STATES PATENT AND TRADEMARK OFFICE
CERTIFICATE OF CORRECTION

PATENT NO. : 7,249,718 B2  Page 1 of 1
APPLICATION NO. : 10/894290
DATED : July 31, 2007
INVENTOR(S) : Abdlmonem H. Beitelmal et al.

It is certified that error appears in the above-identified patent and that said Letters Patent is hereby corrected as shown below:

In column 9, line 60, in Claim 4, delete "fan" and insert -- fans --, therefor.

In column 10, line 21, in Claim 9, delete "Sensor" and insert -- sensor --, therefor.

In column 10, line 45, in Claim 14, delete "beat-generating" and insert -- heat-generating --, therefor.

In column 11, line 15, in Claim 19, delete "to stop" and insert -- the step --, therefor.

In column 11, line 48, in Claim 26, delete "claim 17" and insert -- claim 25 --, therefor.

In column 11, line 56, in Claim 27, delete "stop" and insert -- step --, therefor.

In column 12, line 6, in Claim 31, delete "beat-generating" and insert -- heat-generating --, therefor.

Signed and Sealed this

Twenty-third Day of June, 2009

JOHN DOLL
*Acting Director of the United States Patent and Trademark Office*